United States Patent
Parupalli et al.

(10) Patent No.: US 12,066,514 B2
(45) Date of Patent: Aug. 20, 2024

(54) INTEGRATED THIN-FILM RESISTIVE SENSOR WITH INTEGRATED HEATER AND METAL LAYER THERMAL EQUALIZER

(71) Applicant: CIRRUS LOGIC INTERNATIONAL SEMICONDUCTOR LTD., Edinburgh (GB)

(72) Inventors: Vamsikrishna Parupalli, Austin, TX (US); Zhong You, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 201 days.

(21) Appl. No.: 17/884,521

(22) Filed: Aug. 9, 2022

(65) Prior Publication Data
US 2024/0053425 A1 Feb. 15, 2024

(51) Int. Cl.
*G01R 35/00* (2006.01)
*G01R 27/16* (2006.01)

(52) U.S. Cl.
CPC ........... *G01R 35/005* (2013.01); *G01R 27/16* (2013.01)

(58) Field of Classification Search
CPC ....... G01R 35/005; G01R 27/16; G01N 27/00
USPC ....................................................... 324/601
See application file for complete search history.

(56) References Cited

U.S. PATENT DOCUMENTS

| | | | |
|---|---|---|---|
| 10,123,143 B2 | 11/2018 | Parupalli et al. | |
| 2006/0104330 A1* | 5/2006 | Ho Limb | G01K 7/223 374/1 |
| 2009/0262776 A1* | 10/2009 | Limb | G01K 15/00 374/1 |
| 2012/0293587 A1* | 11/2012 | Bakker | B41J 2/14129 29/890.1 |

(Continued)

FOREIGN PATENT DOCUMENTS

| | | | | |
|---|---|---|---|---|
| CA | 2617402 C | * | 9/2010 | B82Y 25/00 |
| CN | 114256199 A | * | 3/2022 | H01L 23/5228 |

(Continued)

OTHER PUBLICATIONS

U.S. Patent Application "Single-Point Temperature Calibration of Resistance-Based Temperature Measurements", U.S. Appl. No. 17/884,517, filed Aug. 9, 2022. (pp. 1-34 in pdf).

*Primary Examiner* — Tung X Nguyen
*Assistant Examiner* — Robert P Alejnikov, Jr.
(74) *Attorney, Agent, or Firm* — Mitch Harris, Atty at Law, LLC; Andrew M. Harris

(57) ABSTRACT

An integrated circuit (IC) provides on-line, wafer-level, die-level, or package-level thermal calibration of an integrated thin-film resistor, by thermally enclosing the thin-film resistor with metal layers formed above and below the thin-film resistor along its length and width. Metal vias thermally couple the metal layers to the substrate to at least partially equalize the temperature of the metal layers and the thin-film resistor and the substrate. A controllable heat source, which may be provided by another thin-film resistor (Continued)

integrated on or below the substrate, and a reference temperature sensor provide heating/calibration measurement of the resistance of the thin-film resistor over a range of temperature. The reference temperature sensor may be provided within the IC, for example, integrated on the substrate or packaged with the die containing the thin-film resistor, or may be otherwise thermally coupled to the metal layers, e.g., by an extension of one of the metal layers.

28 Claims, 7 Drawing Sheets

(56) References Cited

U.S. PATENT DOCUMENTS

| | | | |
|---|---|---|---|
| 2014/0291677 A1* | 10/2014 | Le Neel | H01L 25/50 |
| | | | 438/49 |
| 2014/0376595 A1* | 12/2014 | Daley | H01L 28/20 |
| | | | 374/185 |
| 2021/0407992 A1* | 12/2021 | Liu | H01C 13/02 |

FOREIGN PATENT DOCUMENTS

| | | | | |
|---|---|---|---|---|
| EP | 3417305 B1 * | 1/2021 | | G01R 1/203 |
| KR | 20140053413 A * | 5/2014 | | G01R 19/16571 |
| WO | WO-2017138380 A1 * | 8/2017 | | G01R 31/2805 |
| WO | WO-2018022757 A1 * | 2/2018 | | G01N 29/022 |

* cited by examiner

INTEGRATED THIN-FILM RESISTIVE SENSOR WITH INTEGRATED HEATER AND METAL LAYER THERMAL EQUALIZER

BACKGROUND

1. Field of Disclosure

The field of representative embodiments of this disclosure relates to integrated circuits (ICs) having an integrated thin-film resistive sensors, and more particularly to an IC having an integrated thin-film resistive sensor with an integrated heater and metal layer thermal equalizer.

2. Background

Resistive sensors are found in current-sensing and voltage-sensing applications, for example in audio amplifiers and motor controllers, in which the output current is measured by including a series resistance in the output circuit, i.e., the circuit driving the particular load(s), e.g., speakers or motor windings. In order to provide accurate results, the ambient temperature of the resistance must typically be known, as well as the temperature coefficient of the specific resistor, as resistive materials typically exhibit a wide degree of variation of resistivity with temperature.

In order to provide an accurate estimate of a resistor's temperature coefficient and initial resistance, calibration measurements and subsequent resistance compensation are typically required, as resistors also typically exhibit substantial variation in fabrication, due to resistive material concentration variation and geometric variations of the fabricated resistor. Depending on the resistive material, a simple linear compensation may not yield sufficiently accurate results over the temperature range the device can be expected to encounter, which further increases the number of data points that are required to characterize and compensate for a particular device.

While laboratory measurements of resistor characteristics can provide information about a range of variation of a fabricated resistor, such measurements are not practical in quantity. In particular, for high-volume integrated circuit (IC) production, for ICs in which the sense resistor is integrated on a die or within an IC package, performing die-level, wafer-level, or package-level tests on individual ICs in a thermally-controlled environment is typically a costly and slow part of the fabrication and test process.

Therefore, it would be advantageous to provide an IC, system and method that provide an accurate thermally-calibrated resistive sensor, without requiring extensive factory-level testing in a thermally-controlled environment.

SUMMARY

Thermal calibration and compensation are provided in integrated circuit (IC), a method of manufacture or the IC, and systems/methods that enable on-line, package-level, die-level or wafer-level calibration of a particular sense resistor or group of sense resistors.

The integrated circuit includes a substrate, a first metal layer formed above a top side of the substrate in a region of the substrate, a first insulating layer formed on a top side of the first metal layer in the region of the substrate, a resistive layer formed on a top side of the first insulating layer and lying at least partially within the region of the substrate, a second insulating layer formed above a top side of the resistive layer in the region of the substrate, a second metal layer formed on the top side of the second insulating layer in the region of the substrate, and a plurality of thermally conductive vias bonded to the first metal layer and the second metal layer to provide thermal flow to at least partially equalize a temperature of the first metal layer and the second metal layer, and wherein the first metal layer and the second metal layer at least partially equalize a temperature along a length and a width of the resistive layer.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses integrated circuits, and systems including the integrated circuits, along with their methods of manufacture. The integrated circuits provide on-line, wafer-level, die-level, or package-level thermal calibration of an integrated thin-film resistor, by thermally enclosing the thin-film resistor with metal layers formed above and below the thin-film resistor along its length and width. Metal vias thermally couple the metal layers to the substrate to at least partially equalize the temperature of the metal layers and the thin-film resistor and the substrate. A controllable heat source, which may be provided by another thin-film resistor integrated on or below the substrate, and a reference temperature sensor may be provided to enable heating/calibration measurement of the resistance of the thin-film resistor over a range of temperature. The reference temperature sensor may be provided within the IC, for example, integrated on the substrate or packaged with the die containing the thin-film resistor, or may be otherwise thermally coupled to the metal layers, e.g., by an extension of one of the metal layers. In one example, the integrated circuit may include features of and may implement a system as described in U.S. patent application entitled: "SINGLE-POINT TEMPERATURE CALIBRATION OF RESISTANCE-BASED TEMPERATURE MEASUREMENTS", filed on Aug. 9, 2022 and published as U.S. Patent Application Publication U.S. 20230366754-A1. The disclosure of the above-referenced U.S. patent application is incorporated herein by reference.

Figure 1:
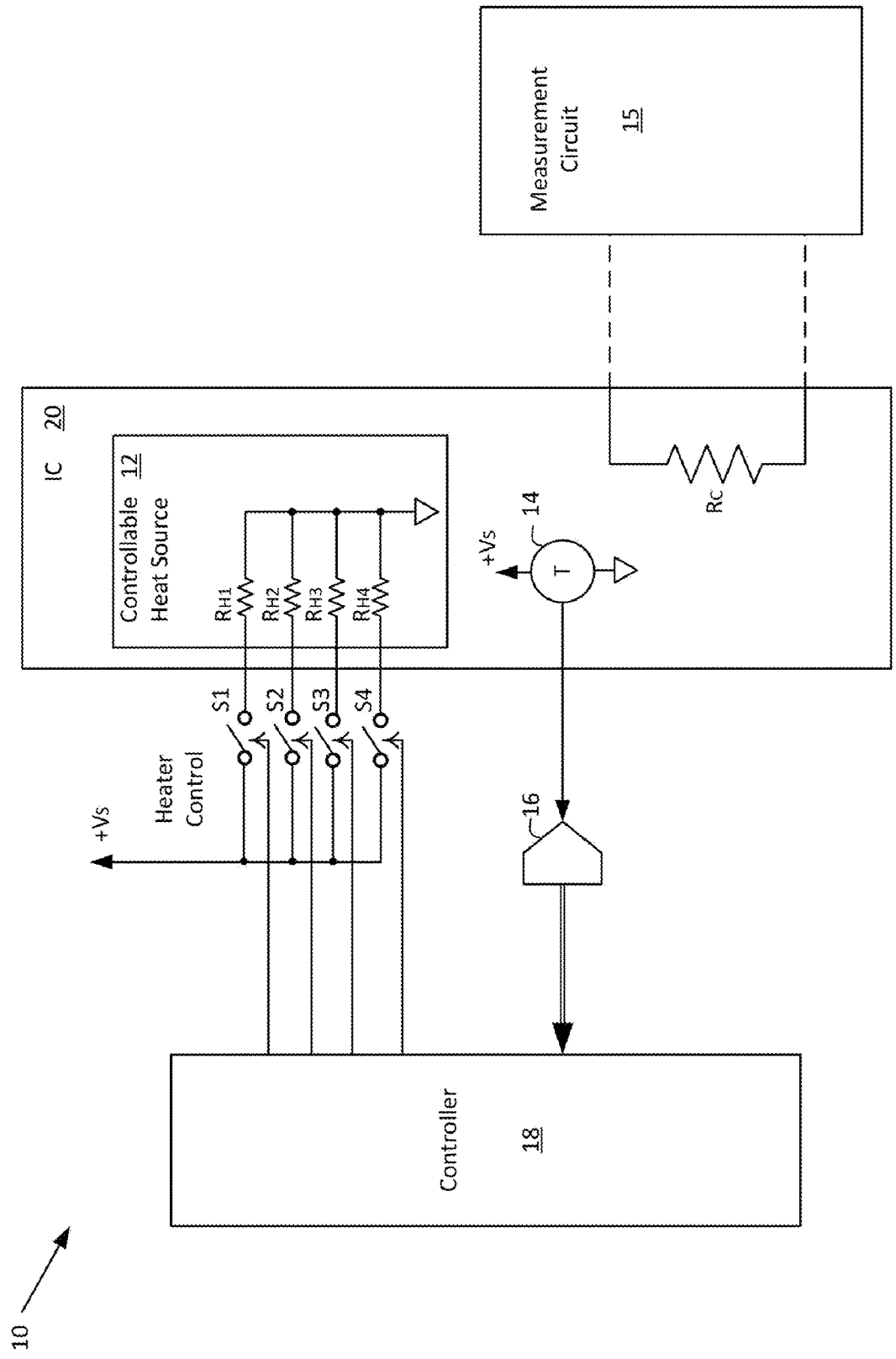
FIG. 1 is a block diagram showing an example system 10, in accordance with an embodiment of the disclosure.

Referring now to FIG. 1, a block diagram is shown illustrating an example system 10, in accordance with an embodiment of the disclosure. System 10 includes a controller 18 that performs measurements and calibration actions to estimate a resistance of a thin-film resistor $R_C$ within an integrated circuit 20 and generate information about the thermal characteristics of thin-film resistor $R_C$ that may be used in subsequent calculations, which may be performed by controller 18 or another processing device. Thin-film resistor $R_C$ may, for example, be part of a series-connected loudspeaker, earspeaker, motor or other circuit, and used to sense the current passing through the circuit by measuring a voltage drop across thin-film resistor $R_C$. In other examples, thin-film resistor $R_C$ may be used to measure a voltage, by measuring a current through thin-film resistor $R_C$. By measuring the present temperature of thin-film resistor $R_C$, and temperature coefficient(s) of thin-film resistor $R_C$ that describe the variation of the resistance of thin-film resistor $R_C$, accurate results may be obtained in such current and voltage measurements beyond those that use either a fixed-resistance value or a temperature-corrected value that is only based on a known/average temperature coefficient for thin-film resistor $R_C$. In order to perform on-line, die-level or wafer-level measurement of the temperature characteristics of thin-film resistor $R_C$, a controllable heat source 12 is provided within integrated circuit 20, which in the example is a set of selectable resistors $R_{H1}$-$R_{H4}$. Control of heat source 12, which is provided by switches S1-S4 in the example, may be external to integrated circuit 20, as shown in FIG. 1, or one or both of switches S1-S4 and controller 18 may be included within integrated circuit 20. While switched resistors are provided as one example of a controllable heat source, other implementations are contemplated by the disclosure, including a variable voltage source/variable current source that may supply a single heat source resistor with a variable level of heat. By setting a fixed level of heat, the temperature of thin-film resistor $R_C$ within integrated circuit 20 may be allowed to stabilize and a resistance of thin-film resistor $R_C$ measured by a measurement circuit 15. The value of the resistance measurement, and the value of the temperature of thin-film resistor $R_C$ may be stored for use in determining a mathematical description of the temperature-dependence of the resistance of thin-film resistor $R_C$. In some implementations, thin-film resistor $R_C$ may be dedicated for thermal characterization of multiple thin-film resistors included within integrated circuit 20, with the expectation that their thermal behavior will be the same, or thin-film resistor $R_C$ may be, as described above, be part of another circuit that may be either selectively enabled/coupled to thin-film resistor $R_C$, or capable of performing the resistance measurement itself.

In order to determine the temperatures at which measurements of the resistance of thin-film resistor $R_C$ are obtained, and also to determine the ambient temperature of thin-film resistor $R_C$ at any future time for appropriate calibration of subsequent measurements using thin-film resistor $R_C$, a reference temperature sensor 14 is incorporated within integrated circuit 20 and coupled to controller 18 via an analog-to-digital converter 16. In order to ensure that the temperatures of temperature sensor 14 and thin-film resistor $R_C$ are the same and that heat from controllable heat source 12 is evenly distributed across thin-film resistor $R_C$, integrated circuit 20 includes thermal management features and thermal coupling features as described in further detail below. Since the close thermal coupling of controllable heat source 12, reference temperature sensor 14, and thin-film resistor $R_C$ is sufficient to provide the needed measurements, other elements in system 10 are not required to be integrated within integrated circuit 20, for example, when off-line testing is used to obtain the calibration characteristics of thin-film resistor $R_C$, some embodiments may include controller 18 and measurement circuit 15 within the tester. In other embodiments, the entirety of system 10 maybe integrated within integrated circuit 20.

Figure 2A:
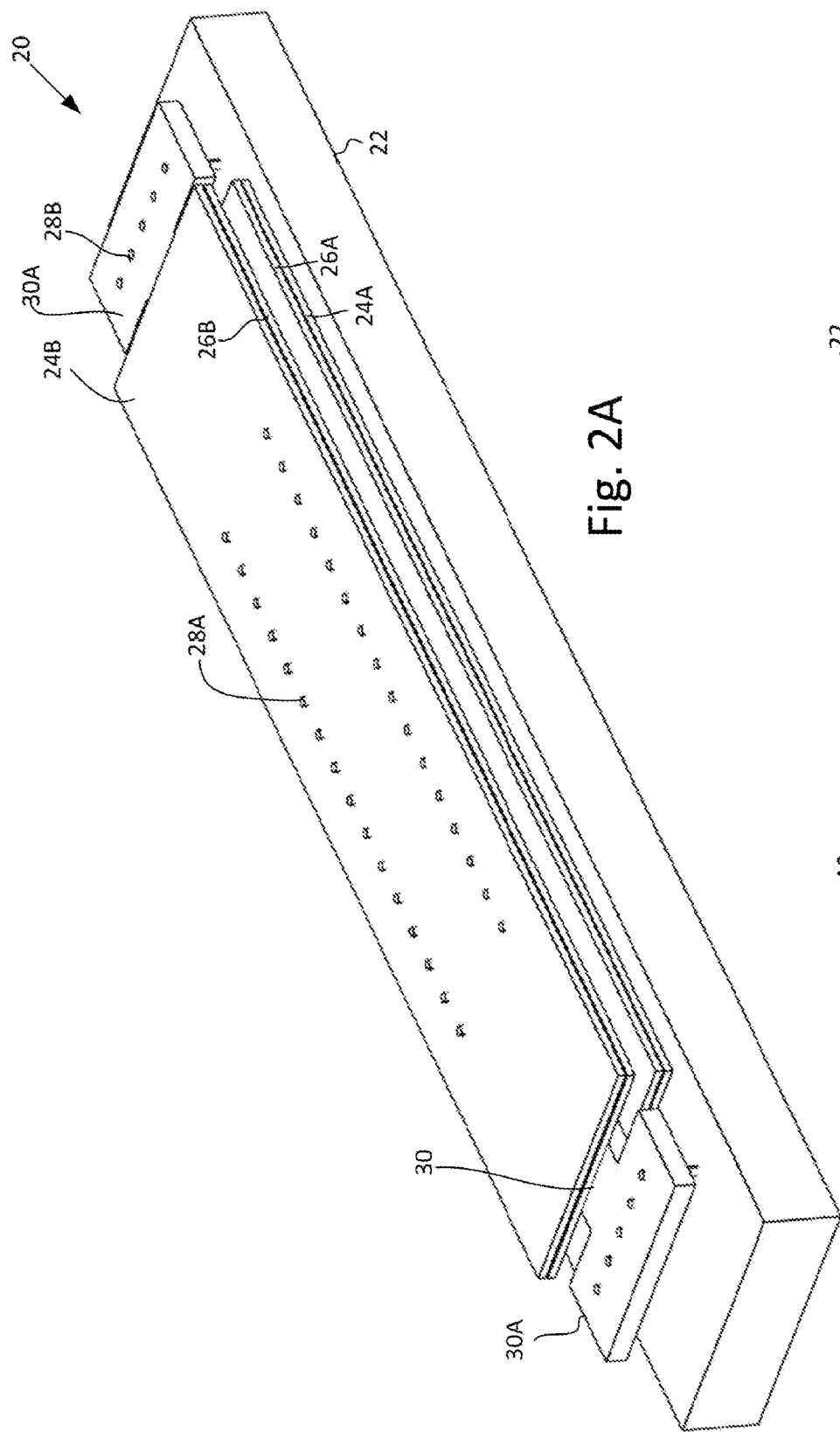
FIG. 2A is a perspective view of an example integrated circuit assembly 20, in accordance with an embodiment of the disclosure.

Referring now to FIG. 2A, a perspective view of an example integrated circuit assembly 20 is shown, in accordance with an embodiment of the disclosure. A thin-film resistor 30, is enclosed in a temperature-equalizing structure provided by a first metal layer 24A disposed beneath thin-film resistor 30 and a second metal layer 24B disposed above thin-film resistor 30. Since metal layers 24A, 24B will generally be laminated or deposited atop a substrate 22, an insulating layer 26A is provided between metal layer 24A and thin-film resistor 30, and an insulating layer 26B is provided between thin-film resistor 30 and metal layer 24B. A first plurality of metal vias 28A connects metal layers 24A, 24B along the length of thin-film resistor 30 on both sides of thin-film resistor 30 and further extend to substrate 22, which may be heated to raise the temperature of thin-film resistor 30 as described above. Electrical connections to thin-film resistor 30 are provided at extensions 30A of the ends of thin-film resistor 30 outside of the region occupied by metal layers 24A, 24B by a second plurality of vias 28B, which also provide thermal coupling of thin-film resistor 30 to substrate 22. By surrounding almost all of the body of thin-film resistor 30 with the thermal-equalizing structure provided by 24A, 24B and vias 28A, and by coupling the ends of thin-film resistor 30 to substrate 22 with vias 28B, the temperature of substrate 22 in region A1 of FIG. 2B, as described below, should closely match the temperature of thin-film resistor 30, and the temperature of thin-film resistor 30 should be substantially equal across the length and width of thin-film resistor 30.

Figure 2B:
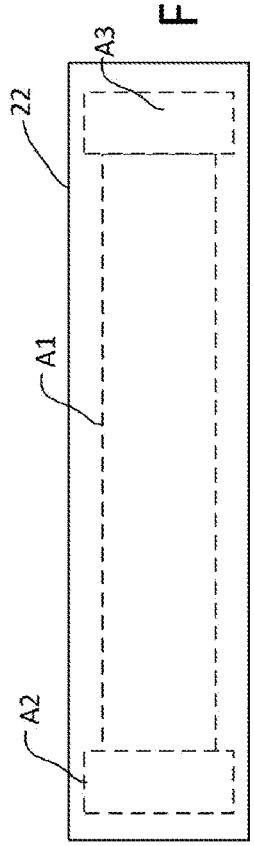
FIG. 2B is a pictorial top view of substrate 22 of example integrated circuit assembly 20, in accordance with an embodiment of the disclosure.

FIG. 2B is a pictorial top view of substrate 22 of integrated circuit assembly 20, in accordance with an embodiment of the disclosure, and which is provided for illustration of a "region of substrate 22 as used herein. A region A1 of substrate 22, in which for example, metal layers 26A, 26B and thin-film resistor $R_C$ are formed and located, is an area of projection on the top and bottom planes of substrate 22 and thin-film resistor $R_C$, and not a requirement that the metal layers 26A, 26B and thin-film resistor $R_C$ actually lie within substrate. Similarly, regions A2 and A3 illustrate regions in which the extensions of thin-film resistor $R_C$ beyond metal layers 26A, 26B provide terminals for connection to the electrical connections of thin-film resistor $R_C$, for example, by conductive vias 28B.

Figure 3A:
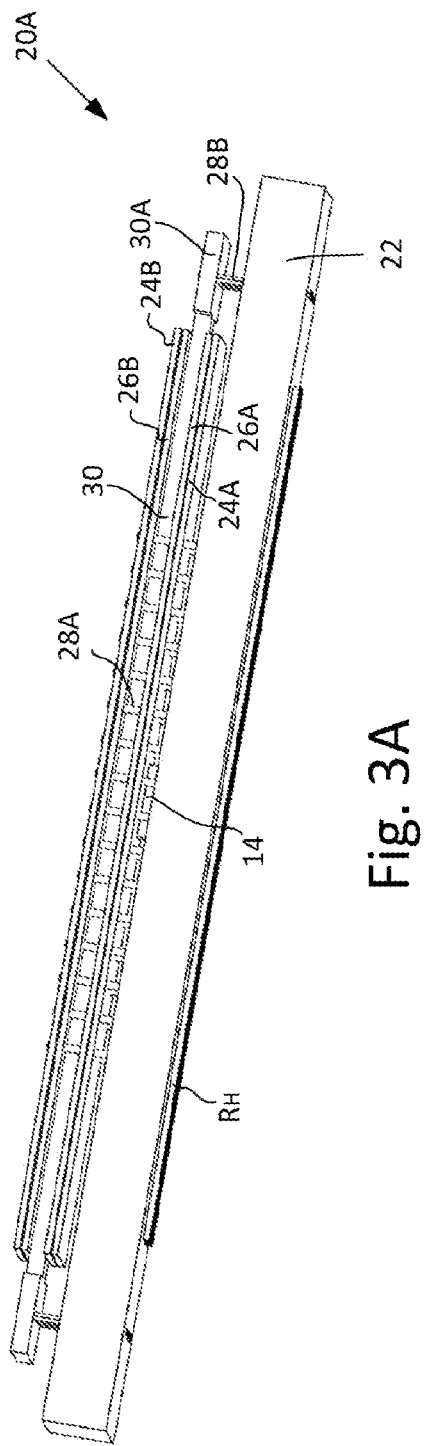
FIG. 3A is a side perspective view of an example integrated circuit assembly 20A, in accordance with another embodiment of the disclosure.
Figure 3B:
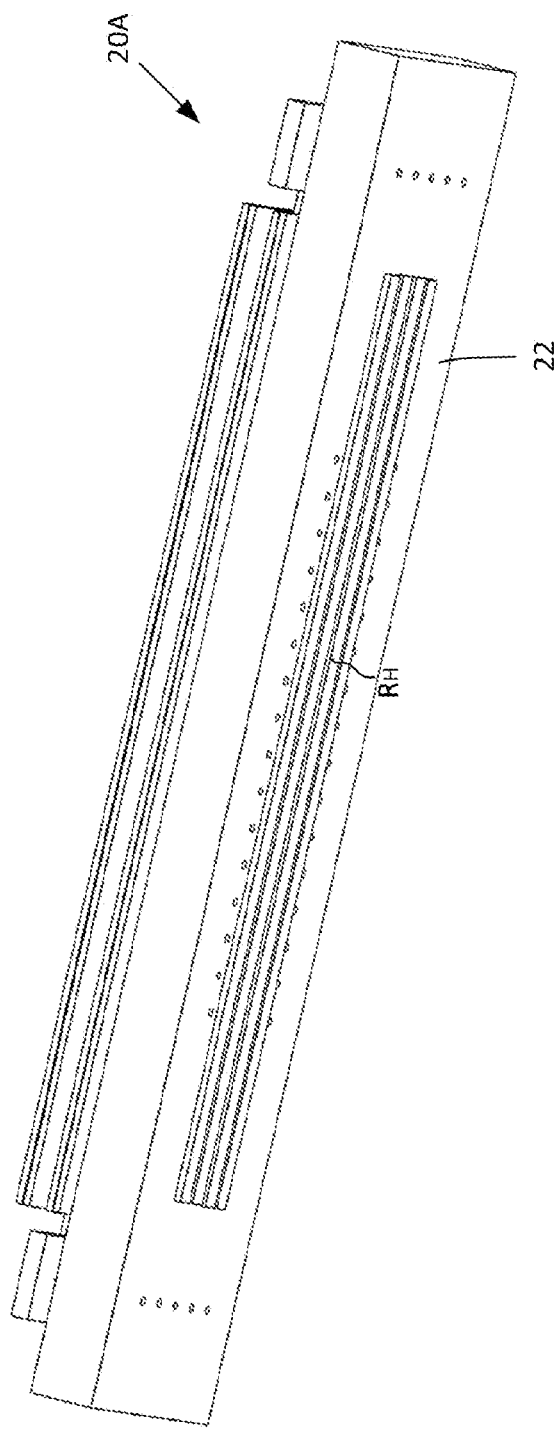
FIG. 3B is a bottom perspective view of integrated circuit assembly 20A of FIG. 3A, in accordance with an embodiment of the disclosure.

Referring now to FIG. 3A, a side perspective view of an example integrated circuit assembly 20A is shown, in accordance with an embodiment of the disclosure. Example integrated circuit assembly 20A includes the features of integrated circuit assembly 20 as described above with reference to FIG. 2A, so only the additional elements of example integrated circuit assembly 20A are described below. Example integrated circuit assembly 20A includes a reference temperature sensor 14 that is integrated underneath metal layer 24A and either bonded to, or integrated on substrate 22 to provide thermal coupling to substrate 22 in the vicinity of vias 28A, so that the temperature sensed by reference temperature sensor 14 is exactly, or very close to, the temperature of thin-film resistor 30. One or more heating resistors RH are laminated or deposited on a bottom side of substrate 22 to provide a controllable heat source, as described above with reference to FIG. 1. FIG. 3B is a bottom perspective view of example integrated circuit assembly 20A of FIG. 3A, in accordance with an embodiment of the disclosure. Heating resistors RH are illustrated as four thin-film resistive strips, which may be connected directly to control circuits integrated on substrate 22, e.g., with additional vias (not shown) or may be contacted via test lands (not shown) for off-line testing at wafer-level or die-level calibration.

Figure 4:
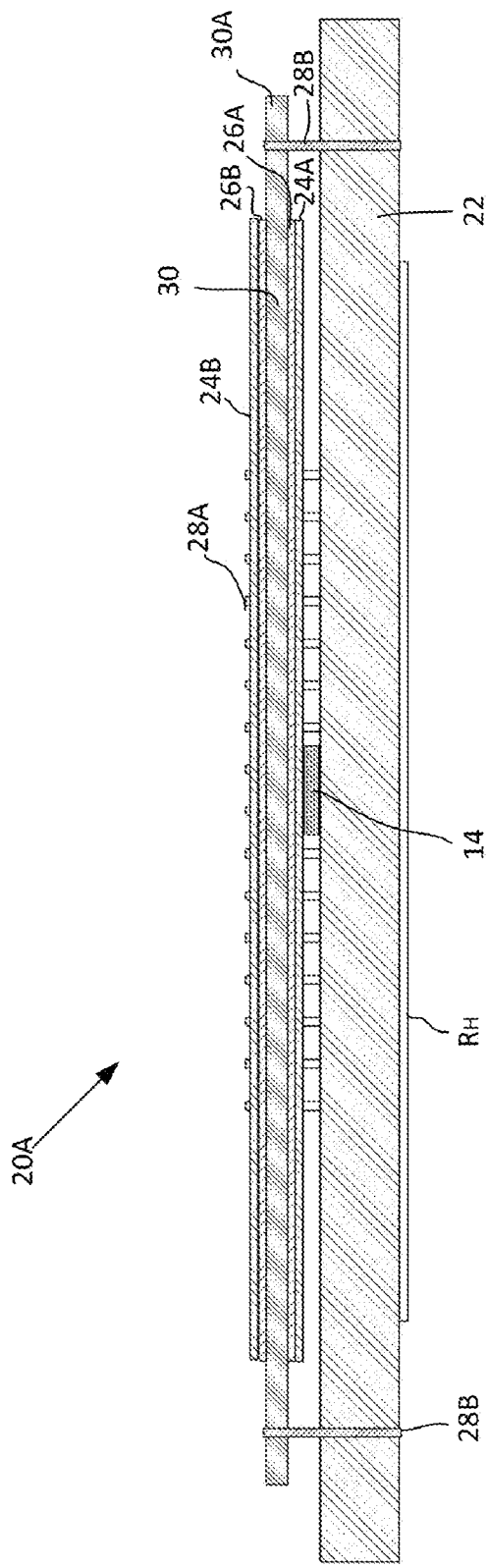
FIG. 4 is a cross-section view of integrated circuit assembly 20A of FIG. 3A, in accordance with an embodiment of the disclosure.

Referring now to FIG. 4, a cross-section view of example integrated circuit assembly 20A of FIG. 3A is shown, in accordance with an embodiment of the disclosure. Reference temperature sensor 14 is located between metal layer 24A and a top surface of substrate 22 and may contact metal layer 24A, as well as substrate 22. Heating resistors RH are located on a bottom face of substrate 22. Extensions 30A of thin-film resistor 30 are seen extending past the region of metal layers 24A, 24B, so that vias 28B are capable of providing electrically-isolated connections to thin film resistor 30.

Figure 5:
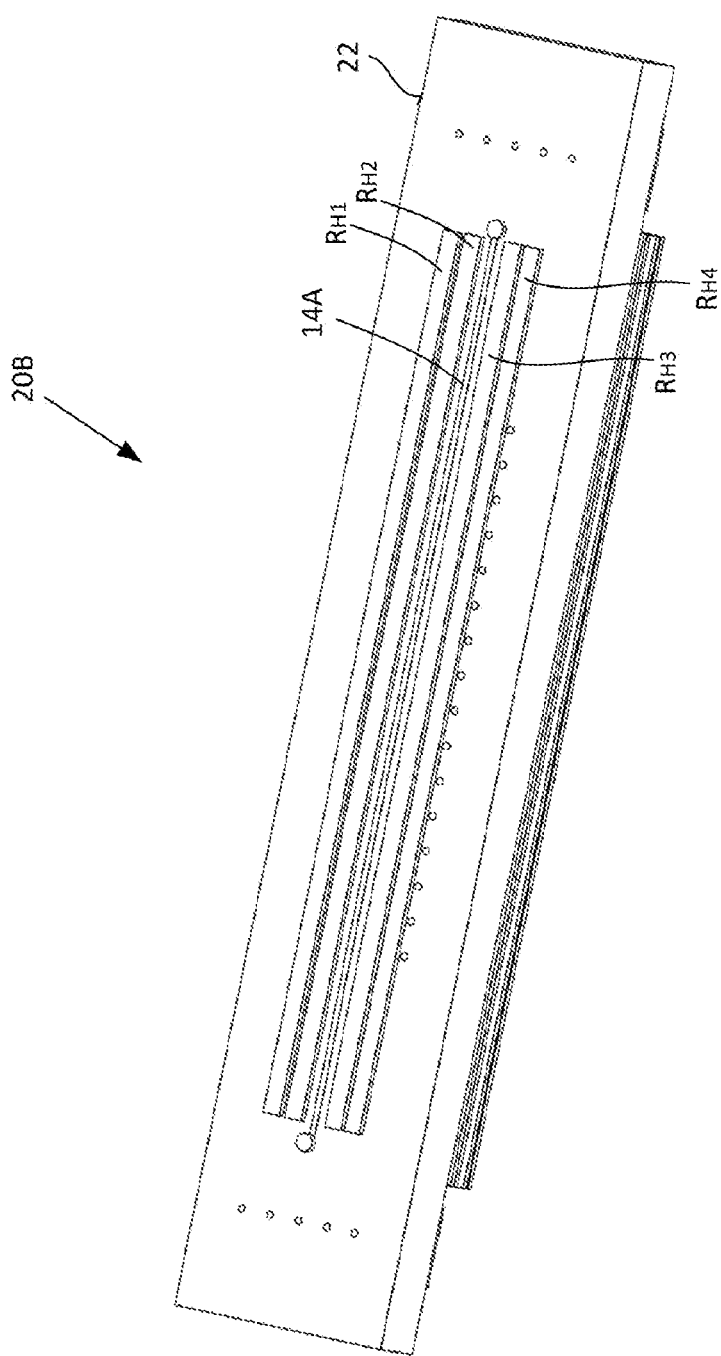
FIG. 5 is a bottom perspective view of another example integrated circuit assembly 20B, in accordance with another embodiment of the disclosure.

Referring now to FIG. 5, a bottom perspective view of another example integrated circuit assembly 20B is shown, in accordance with an embodiment of the disclosure. Example integrated circuit assembly 20B includes the features of integrated circuit assembly 20 as described above with reference to FIG. 2A, so only the additional elements of example integrated circuit assembly 20B are described below. In example integrated circuit assembly 20B, reference temperature sensor 14 of FIG. 1 is provided by a thin-film resistor or wire 14A that is provided on the bottom of substrate 20 along with heating resistors $R_{H1}$-$R_{H4}$.

Figure 6:
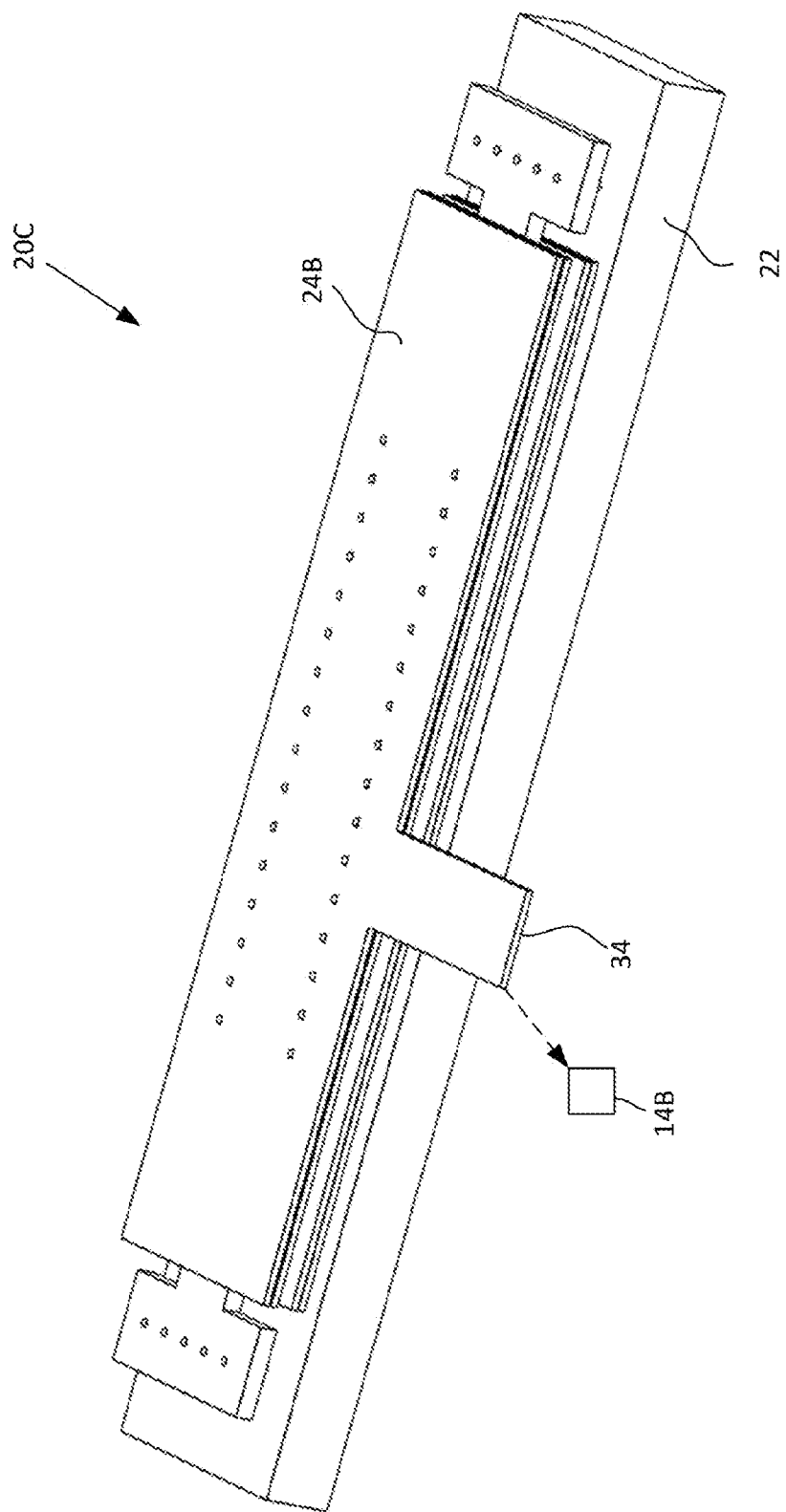
FIG. 6 is a top perspective view of another example integrated circuit assembly 20C, in accordance with another embodiment of the disclosure.

Referring now to FIG. 6, a top perspective view of another example integrated circuit assembly 20C is shown, in accordance with an embodiment of the disclosure. Example integrated circuit assembly 20C includes the features of integrated circuit assembly 20 as described above with reference to FIG. 2A, so only the additional elements of example integrated circuit assembly 20C are described below. In example integrated circuit assembly 20C, top metal layer 24B has an extension 34 that may be used to provide thermal contact with a reference temperature sensor 14B. For example, extension 34 may be exposed at a top of a package encapsulating example integrated circuit assembly 20C for thermal contact by an external temperature sensor, or extension 34 may make contact with a temperature sensor that is within a package containing example integrated circuit assembly 20C, but that is not integrated on or affixed to substrate. While extension 34 is illustrated as an extension of top metal layer 24B, extension 34 may be alternatively provided from lower metal layer 24A.

Figure 7A:
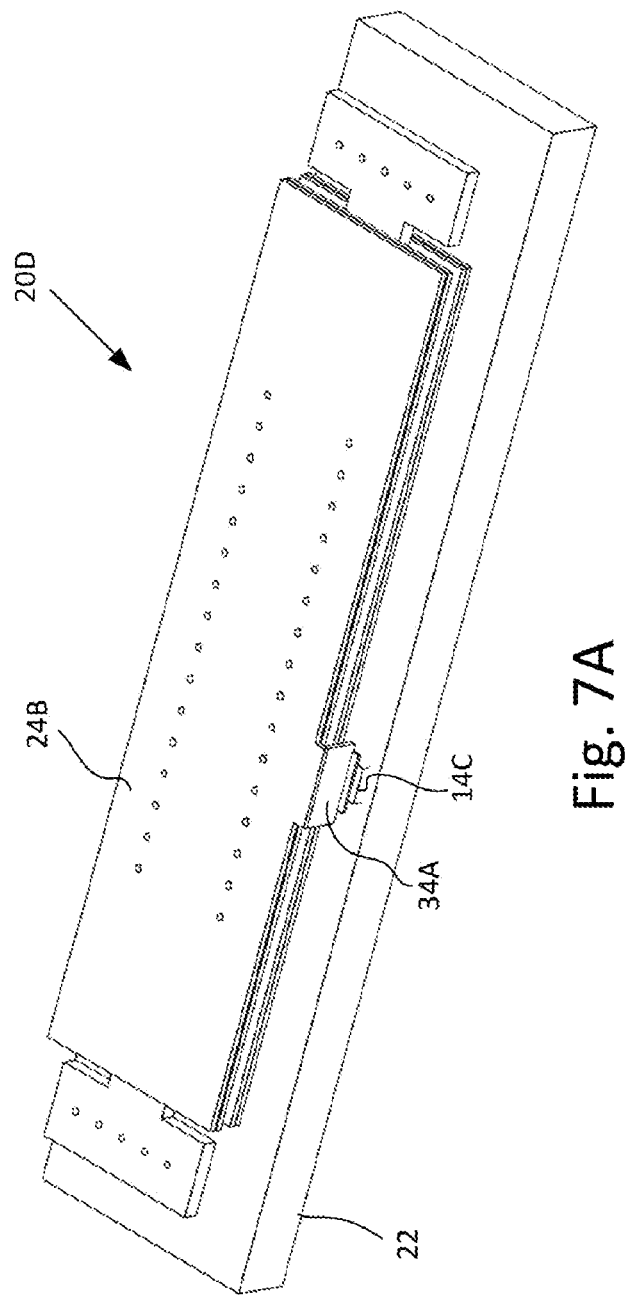
FIG. 7A is a top perspective view.
Figure 7B:
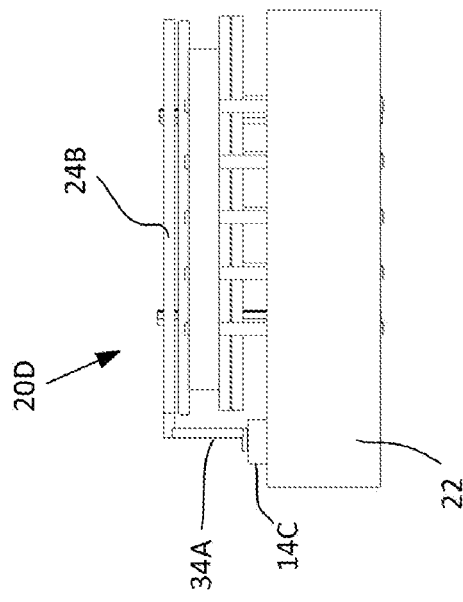
FIG. 7B is an end view, of another example integrated circuit assembly 20D, in accordance with another embodiment of the disclosure.

Referring now to FIG. 7A and FIG. 7B, a top view and an end view, respectively, are shown of another example integrated circuit assembly 20D, in accordance with an embodiment of the disclosure. Example integrated circuit assembly 20D includes the features of integrated circuit assembly 20 as described above with reference to FIG. 2A, so only the additional elements of example integrated circuit assembly 20D are described below. In example integrated circuit assembly 20D, top metal layer 24B has an extension 34A that is bent downward to contact a reference temperature sensor 14C that is affixed to or integrated on substrate 22, and provides another convenient thermal connection to the temperature-equalizing structure formed by metal layers 24A, 24B and vias 28A.

In summary, this disclosure shows and describes integrated circuits and their methods of manufacture, and systems incorporating an integrated circuit. The integrated circuits may include a substrate, a first metal layer formed above a top side of the substrate in a region of the substrate, a first insulating layer formed on a top side of the first metal layer in the region of the substrate, a resistive layer formed on a top side of the first insulating layer and lying at least partially within the region of the substrate, a second insulating layer formed above a top side of the resistive layer in the region of the substrate, a second metal layer formed on the top side of the second insulating layer in the region of the substrate, and a plurality of thermally conductive vias bonded to the first metal layer and the second metal layer to provide thermal flow to at least partially equalize a temperature of the first metal layer and the second metal layer, and wherein the first metal layer and the second metal layer at least partially equalize a temperature along a length and a width of the resistive layer. The systems may include the integrated circuit as described above, and may include reference temperature sensor attached to the substrate, or separate from the substrate or IC package.

In some example embodiments, the plurality of thermally conductive vias may be bonded to the substrate. In some example embodiments, at least one end of the resistive layer may extend outside of the resistive layer on a least one end, and the at least one end of the resistive layer may terminate in one or more electrically-conductive and thermally conductive terminals. The plurality of thermally conductive vias may be a first plurality of thermally conductive vias, and the integrated circuit may further include a second plurality of thermally and electrically conductive vias for making electrical connections to the resistive layer and to provide thermal flow between the resistive layer and the substrate to equalize a temperature of the resistive layer and the substrate.

In some example embodiments, a reference temperature sensor may be attached to the substrate for providing a reference temperature measurement, and the reference temperature sensor may be located underneath the resistive layer between rows of the plurality of vias. In some example embodiments, the reference temperature sensor may include another resistive layer formed below the second insulating layer. In some example embodiments, the integrated circuit may include a reference temperature measurement circuit that has an input coupled to the reference temperature sensor for providing an output indicative of a temperature of the first metal layer, the second metal layer, and the resistive layer. In some example embodiments, the reference temperature measurement may include an analog-to-digital converter and provides a digital output indicative of the temperature of the first metal layer, the second metal layer, and the resistive layer.

In some example embodiments, the integrated circuit may include a controllable heat source thermally coupled to the plurality of thermally conductive vias to raise a temperature of the resistive layer by heating the first metal layer and the second metal layers. The plurality of vias may extend the substrate in a vicinity of the controllable heat source, so that the controllable heat source heats the first metal layer and the second metal layers through the plurality of vias. In some example embodiments, the controllable heat source may be bonded to, or formed on, a bottom side of the substrate within the region of the substrate, and the plurality of vias may extend through the substrate in the vicinity of the controllable heat source. In some example embodiments, the other resistive layer may be formed below the substrate. In some example embodiments, the controllable heat source may be formed by a resistive layer forming one or more resistive strips that may be energized to heat the plurality of vias.

In some example embodiments, the IC may form part of a system that includes a reference temperature sensor separate from the substrate for providing a reference temperature measurement indicative of a temperature of the first metal layer and the second metal layer, and that may include a reference temperature measurement circuit having an input coupled to the reference temperature sensor for providing an output indicative of a temperature of the first metal layer and the second metal layer.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in a thermal sensing module forming a separate integrated circuit.

What is claimed is:

1. An integrated circuit, comprising:
a substrate;
a first metal layer formed above a top side of the substrate in a region of the substrate;
a first insulating layer formed on a top side of the first metal layer in the region of the substrate;
a resistive layer formed on a top side of the first insulating layer and lying at least partially within the region of the substrate;
a second insulating layer formed above a top side of the resistive layer in the region of the substrate;
a second metal layer formed on the top side of the second insulating layer in the region of the substrate; and
a plurality of thermally conductive vias bonded to the first metal layer and the second metal layer to provide thermal flow to at least partially equalize a temperature of the first metal layer and the second metal layer, and wherein the first metal layer and the second metal layer at least partially equalize a temperature along a length and a width of the resistive layer.

2. The integrated circuit of claim 1, wherein the plurality of thermally conductive vias are bonded to the substrate.

3. The integrated circuit of claim 2, wherein at least one end of the resistive layer extends outside of the region on a least one end thereof, wherein the at least one end of the resistive layer terminates in one or more electrically-conductive and thermally conductive terminals, wherein the plurality of thermally conductive vias is a first plurality of thermally conductive vias, and wherein the integrated circuit further comprises a second plurality of thermally and electrically conductive vias for making electrical connections to the resistive layer and to provide thermal flow between the resistive layer and the substrate to equalize a temperature of the resistive layer and the substrate.

4. The integrated circuit of claim 1, further comprising a reference temperature sensor attached to the substrate for providing a reference temperature measurement.

5. The integrated circuit of claim 4, wherein the reference temperature sensor is located underneath the resistive layer between rows of the plurality of vias.

6. The integrated circuit of claim 4, wherein the reference temperature sensor includes another resistive layer formed below the second insulating layer.

7. The integrated circuit of claim 4, further comprising a reference temperature measurement circuit having an input coupled to the reference temperature sensor for providing an output indicative of a temperature of the first metal layer, the second metal layer, and the resistive layer.

8. The integrated circuit of claim 4, wherein the reference temperature measurement circuit comprises an analog-to-digital converter and provides a digital output indicative of the temperature of the first metal layer, the second metal layer, and the resistive layer.

9. The integrated circuit of claim 1, further comprising a controllable heat source thermally coupled to the plurality of thermally conductive vias to raise a temperature of the resistive layer by heating the first metal layer and the second metal layers.

10. The integrated circuit of claim 9, wherein the plurality of vias extend to the substrate in vicinity of the controllable heat source, whereby the controllable heat source heats the first metal layer and the second metal layers through the plurality of vias by the contact of the plurality of vias with the substrate.

11. The integrated circuit of claim 10, wherein the controllable heat source is bonded to or formed on a bottom side of the substrate within the region of the substrate.

12. The integrated circuit of claim 9, wherein the controllable heat source is formed by a resistive layer forming one or more resistive strips that may be energized to heat the plurality of vias.

13. A method of manufacture of an integrated circuit, comprising:
providing a substrate;
forming a first metal layer above a top side of the substrate in a region of the substrate;
forming a first insulating layer on a top side of the first metal layer in the region of the substrate;
forming a resistive layer on a top side of the first insulating layer and lying at least partially within the region of the substrate;
forming a second insulating layer above a top side of the resistive layer in the region of the substrate;
forming a second metal layer on the top side of the second insulating layer in the region of the substrate; and
forming a plurality of thermally conductive vias bonded to the first metal layer and the second metal layer to provide a thermal connection for temperature equalization of the first metal layer and the second metal layer along a length and a width of the resistive layer.

14. The method of claim 13, wherein the forming the plurality of thermally conductive vias bonds the plurality of thermally conductive vias to the substrate.

15. The method of claim 14, wherein at least one end of the resistive layer extends outside of the region on a least one end thereof, wherein the at least one end of the resistive layer terminates in one or more electrically-conductive and thermally conductive terminals, wherein the forming the plurality of thermally conductive vias forms a first plurality of thermally conductive vias, and wherein the method further comprises forming a second plurality of thermally and electrically conductive vias for making electrical connections to the resistive layer and providing thermal flow between the resistive layer and the substrate to equalize a temperature of the resistive layer and the substrate.

16. The method of claim 13, further comprising attaching a reference temperature sensor to or forming the reference temperature sensor on the substrate for providing a reference temperature indication.

17. The method of claim 16, wherein the reference temperature sensor is attached or formed underneath the resistive layer between rows of the plurality of vias.

18. The method of claim 16, wherein the attaching or forming the reference temperature sensor comprises forming another resistive layer below the second insulating layer.

19. The method of claim 16, further comprising measuring a temperature of the first metal layer, the second metal layer, and the resistive layer with a reference temperature measurement circuit having an input coupled to the reference temperature sensor.

20. The method of claim 16, wherein the reference temperature measurement comprises an analog-to-digital converter and provides a digital output indicative of the temperature of the first metal layer, the second metal layer, and the resistive layer.

21. The method of claim 13, further comprising providing a controllable heat source on the substrate, whereby the controllable heat source is thermally coupled to the plurality of thermally conductive vias.

22. The method of claim 21, wherein the plurality of vias extend to the substrate in the vicinity of the controllable heat source, whereby the controllable heat source heats the first metal layer and the second metal layers through the plurality of vias.

23. The method of claim 22, wherein the providing a controllable heat source bonds the controllable heat source to or forms the controllable heat source on a bottom side of the substrate within the region of the substrate.

24. The method of claim 21, wherein the providing a controllable heat source comprises forming a resistive layer on the substrate that includes one or more resistive strips that may be energized to heat the plurality of vias.

25. A system comprising:
an integrated circuit, including a substrate, a first metal layer formed above a top side of the substrate in a region of the substrate, a first insulating layer formed on a top side of the first metal layer in the region of the substrate, a resistive layer formed on a top side of the first insulating layer within the region of the substrate, a second insulating layer formed above a top side of the resistive layer in the region of the substrate, a second metal layer formed on the top side of the second insulating layer in the region of the substrate, and a plurality of thermally conductive vias bonded to the first metal layer and the second metal layer to provide thermal flow to at least partially equalize a temperature of the first metal layer and the second metal layer, and wherein the first metal layer and the second metal layer at least partially equalize a temperature along a length and a width of the resistive layer;
a reference temperature sensor separate from the substrate for providing a reference temperature measurement indicative of a temperature of the first metal layer and the second metal layer; and
a reference temperature measurement circuit having an input coupled to the reference temperature sensor for providing an output indicative of a temperature of the first metal layer and the second metal layer.

26. A method of measuring a temperature of a measurement resistor, comprising:
providing an integrated circuit, including a substrate, a first metal layer formed above a top side of the substrate in a region of the substrate, a first insulating layer formed on a top side of the first metal layer in the region of the substrate, a resistive layer formed on a top side of the first insulating layer within the region of the substrate, the resistive layer providing the measurement resistor, a second insulating layer formed above a top side of the resistive layer in the region of the substrate, a second metal layer formed on the top side of the second insulating layer in the region of the substrate, and a plurality of thermally conductive vias bonded to the first metal layer and the second metal layer to provide thermal flow to at least partially equalize a temperature of the first metal layer and the second metal layer, and wherein the first metal layer and the second metal layer at least partially equalize a temperature along a length and a width of the resistive layer;
obtaining a reference temperature indication that is indicative of a temperature of the first metal layer and the second metal layer from a reference temperature sensor; and
measuring the temperature of the first metal layer and the second metal layer with a reference temperature measurement circuit having an input coupled to the reference temperature sensor.

27. The method of claim 26, wherein the reference temperature sensor is separate from the substrate.

28. The method of claim 26, wherein the reference temperature sensor is integrated on the substrate.

* * * * *